United States Patent
Banine et al.

(10) Patent No.: US 10,678,140 B2
(45) Date of Patent: Jun. 9, 2020

(54) SUPPRESSION FILTER, RADIATION COLLECTOR AND RADIATION SOURCE FOR A LITHOGRAPHIC APPARATUS; METHOD OF DETERMINING A SEPARATION DISTANCE BETWEEN AT LEAST TWO REFLECTIVE SURFACE LEVELS OF A SUPPRESSION FILTER

(71) Applicant: ASML Netherlands B.V., Veldhoven (NL)

(72) Inventors: Vadim Yevgenyevich Banine, Deurne (NL); Han-Kwang Nienhuys, Utrecht (NL); Luigi Scaccabarozzi, Valkenswaard (NL)

(73) Assignee: ASML Netherlands B.V., Veldhoven (NL)

( * ) Notice: Subject to any disclaimer, the term of this patent is extended or adjusted under 35 U.S.C. 154(b) by 23 days.

(21) Appl. No.: 15/753,811

(22) PCT Filed: Aug. 2, 2016

(86) PCT No.: PCT/EP2016/068445
§ 371 (c)(1),
(2) Date: Feb. 20, 2018

(87) PCT Pub. No.: WO2017/032569
PCT Pub. Date: Mar. 2, 2017

(65) Prior Publication Data
US 2018/0246414 A1    Aug. 30, 2018

(30) Foreign Application Priority Data
Aug. 25, 2015   (EP) ................................. 15182402

(51) Int. Cl.
*G03F 7/20* (2006.01)
*H05G 2/00* (2006.01)
(Continued)

(52) U.S. Cl.
CPC ....... *G03F 7/70191* (2013.01); *G02B 5/1861* (2013.01); *G02B 5/208* (2013.01);
(Continued)

(58) Field of Classification Search
None
See application file for complete search history.

(56) References Cited

U.S. PATENT DOCUMENTS

| 4,915,463 A | 4/1990 | Barbee, Jr. |
| 10,228,615 B2 * | 3/2019 | Nikipelov ................ G03F 1/62 |

(Continued)

FOREIGN PATENT DOCUMENTS

| DE | 10 2009 044462 A1 | 1/2011 | |
| WO | WO-2014114405 A3 * | 9/2014 | ......... G03F 7/70158 |

OTHER PUBLICATIONS

International Search Report and Written Opinion of the International Searching Authority directed to related International Patent Application No. PCT/EP2016/068445, dated Nov. 16, 2016; 12 pages.

(Continued)

*Primary Examiner* — Michael J Logie
(74) *Attorney, Agent, or Firm* — Sterne, Kessler, Goldstein & Fox P.L.L.C.

(57) ABSTRACT

Disclosed is a suppression filter having a profile defining at least two reflective surface levels, each reflected surface level being separated by a separation distance. The separation distance is such that the reflective suppression filter is operable to substantially prevent specular reflection of radiation at a first wavelength and at a second wavelength incident on said reflective suppression filter. Also disclosed is a radiation collector, radiation source and lithographic apparatus comprising such a suppression filter, and to a method of determining a separation distance between at least two reflective surface levels of a suppression filter.

7 Claims, 4 Drawing Sheets

(51) Int. Cl.
*G02B 5/18* (2006.01)
*G02B 27/42* (2006.01)
*G02B 5/20* (2006.01)
*G02B 5/28* (2006.01)

(52) U.S. Cl.
CPC ......... *G02B 5/281* (2013.01); *G02B 27/4244* (2013.01); *G02B 27/4277* (2013.01); *G03F 7/70033* (2013.01); *G03F 7/70158* (2013.01); *G03F 7/70175* (2013.01); *G03F 7/70575* (2013.01); *H05G 2/008* (2013.01)

(56) References Cited

U.S. PATENT DOCUMENTS

| | | | | |
|---|---|---|---|---|
| 2003/0232179 | A1* | 12/2003 | Steenblik | B82Y 20/00 428/195.1 |
| 2005/0275818 | A1* | 12/2005 | Singer | G01J 3/18 355/55 |
| 2006/0152809 | A1* | 7/2006 | Smith | G02B 5/1809 359/569 |
| 2008/0088853 | A1* | 4/2008 | Hwang | G01B 11/002 356/498 |
| 2009/0025783 | A1* | 1/2009 | Wernham | G02B 5/282 136/256 |
| 2013/0207004 | A1* | 8/2013 | Ceglio | G21K 1/067 250/504 R |
| 2014/0085619 | A1* | 3/2014 | Banine | B82Y 10/00 355/71 |
| 2015/0049321 | A1* | 2/2015 | Bieling | G02B 17/002 355/71 |
| 2016/0274467 | A1* | 9/2016 | Schimmel | G03F 7/70033 |
| 2017/0182597 | A1* | 6/2017 | Abdou-Ahmed | B23K 26/0676 |
| 2017/0365371 | A1* | 12/2017 | Huang | G21K 1/062 |

OTHER PUBLICATIONS

International Preliminary Report on Patentability directed to related International Patent Application No. PCT/EP2016/068445, dated Feb. 27, 2018; 9 pages.

* cited by examiner

SUPPRESSION FILTER, RADIATION COLLECTOR AND RADIATION SOURCE FOR A LITHOGRAPHIC APPARATUS; METHOD OF DETERMINING A SEPARATION DISTANCE BETWEEN AT LEAST TWO REFLECTIVE SURFACE LEVELS OF A SUPPRESSION FILTER

CROSS-REFERENCE TO RELATED APPLICATIONS

This application claims priority of EP application 15182402.6, which was filed on Aug. 25, 2015 and which is incorporated in its entirety by reference.

FIELD

The present invention relates to a suppression filter, radiation collector and radiation source for a lithographic apparatus. The present invention also relates to a lithographic apparatus comprising such a radiation source, and to a method of determining a separation distance between at least two reflective surface levels of a suppression filter.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

A theoretical estimate of the limits of pattern printing can be given by the Rayleigh criterion for resolution as shown in equation (1):

$$CD = k_1 * \frac{\lambda}{NA} \quad (1)$$

where $\lambda$ is the wavelength of the radiation used, NA is the numerical aperture of the projection system used to print the pattern, k1 is a process dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture NA or by decreasing the value of k1.

In order to shorten the exposure wavelength and, thus, reduce the minimum printable size, it has been proposed to use an extreme ultraviolet (EUV) radiation source. EUV radiation is electromagnetic radiation having a wavelength within the range of 5-20 nm, for example within the range of 13-14 nm. It has further been proposed that EUV radiation with a wavelength of less than 10 nm could be used, for example within the range of 5-10 nm such as 6.7 nm or 6.8 nm. Such radiation is termed extreme ultraviolet radiation or soft x-ray radiation. Possible sources include, for example, laser-produced plasma sources, discharge plasma sources, or sources based on synchrotron radiation provided by an electron storage ring.

EUV radiation may be produced using a plasma. A radiation system for producing EUV radiation may include a laser for exciting a fuel to provide the plasma, and a source collector apparatus for containing the plasma. The plasma may be created, for example, by directing a laser beam at a fuel, such as particles of a suitable material (e.g. tin), or a stream of a suitable gas or vapor, such as Xe gas or Li vapor. The resulting plasma emits output radiation, e.g., EUV radiation, which is collected using a radiation collector. The radiation collector may be a mirrored normal incidence radiation collector, which receives the radiation and focuses the radiation into a beam. The source collector apparatus may include an enclosing structure or chamber arranged to provide a vacuum environment to support the plasma. Such a radiation system is typically termed a laser produced plasma (LPP) source.

To increase EUV output, it is desirable to increase output power of the laser used to excite the plasma. One way of increasing output power is by utilizing more than one output wavelength line. However, this presents an issue when preventing this laser radiation from being output with the EUV radiation. To prevent laser radiation, which may be reflected from the fuel to the radiation collector) from being collected by the radiation collector, a suppression filter, which may take the form of a grating, may be located on (or integral to) the radiation collector. Such a suppression filter will be specifically tuned to suppress a particular wavelength. Using laser radiation of more than one wavelength therefore presents a problem.

SUMMARY

It would be desirable to provide a suppression filter usable with a laser having an output at two wavelengths.

The invention in a first aspect provides a suppression filter having a profile defining at least two reflective surface levels, each reflected surface level being separated by a separation distance, wherein said separation distance is such that said reflective suppression filter is operable to substantially prevent specular reflection of radiation at a first wavelength $\lambda_1$ and at a second wavelength $\lambda_2$ incident on said reflective suppression filter.

The invention in a second aspect provides a method of determining a separation distance between at least two reflective surface levels of a suppression filter, such that said suppression filter is operable to substantially prevent specular reflection of radiation at a first wavelength $\lambda_1$ and at a second wavelength $\lambda_2$ incident on said reflective suppression filter, said method comprising: minimizing the difference between a first product and a second product, said first product being the product of said first wavelength and a first factor dependent upon a first approximate integer $n_1$ and said second product being the product of said second wavelength and a second factor dependent upon a second approximate integer $n_2$; and determining the separation distance as that corresponding to said minimization.

The invention further provides for a radiation collector, a radiation source and a lithographic apparatus each comprising a suppression filter of the first aspect.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention. Embodiments of the invention are described, by way of example only, with reference to the accompanying drawings, in which.

Figure 1:
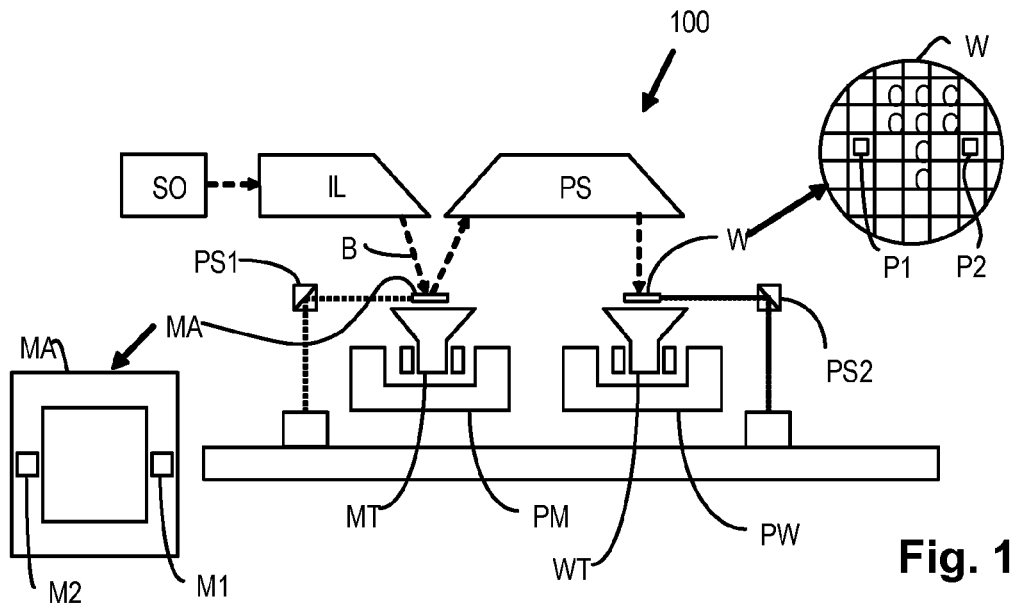
FIG. 1 depicts schematically a lithographic apparatus having reflective projection optics.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements.

DETAILED DESCRIPTION OF EXEMPLARY EMBODIMENTS

FIG. 1 schematically depicts a lithographic apparatus 100 including a source module SO according to one embodiment of the invention. The apparatus comprises:
- an illumination system (illuminator) IL configured to condition a radiation beam B (e.g. EUV radiation).
- a support structure (e.g. a mask table) MT constructed to support a patterning device (e.g. a mask or a reticle) MA and connected to a first positioner PM configured to accurately position the patterning device;
- a substrate table (e.g. a wafer table) WT constructed to hold a substrate (e.g. a resist-coated wafer) W and connected to a second positioner PW configured to accurately position the substrate; and
- a projection system (e.g. a reflective projection system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The projection system, like the illumination system, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since other gases may absorb too much radiation. A vacuum environment may therefore be provided to the whole beam path with the aid of a vacuum wall and vacuum pumps.

As here depicted, the apparatus is of a reflective type (e.g. employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives an extreme ultra violet radiation beam from the source module SO. Methods to produce EUV light include, but are not necessarily limited to, converting a material into a plasma state that has at least one element, e.g., xenon, lithium or tin, with one or more emission lines in the EUV range. In one such method, often termed laser produced plasma ("LPP") the required plasma can be produced by irradiating a fuel, such as a droplet, stream or cluster of material having the required line-emitting element, with a laser beam. The source module SO may be part of an EUV radiation system including a laser, not shown in FIG. 1, for providing the laser beam exciting the fuel. The resulting plasma emits output radiation, e.g., EUV radiation, which is collected using a radiation collector, disposed in the source module. The laser and the source module may be separate entities, for example when a CO2 laser is used to provide the laser beam for fuel excitation.

In such cases, the laser is not considered to form part of the lithographic apparatus and the radiation beam is passed from the laser to the source module with the aid of a beam delivery system comprising, for example, suitable directing mirrors and/or a beam expander. In other cases the source may be an integral part of the source module, for example when the source is a discharge produced plasma EUV generator, often termed as a DPP source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using mask alignment marks M1, M2 and substrate alignment marks P1, P2.

The depicted apparatus could be used in at least one of the following modes:

1. In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

2. In scan mode, the support structure (e.g. mask table) MT and the substrate table WT are scanned synchronously while a pattern imparted to the radiation beam is projected onto a target portion C (i.e. a single dynamic exposure). The velocity and direction of the substrate table WT relative to the support structure (e.g. mask table) MT may be determined by the (de-)magnification and image reversal characteristics of the projection system PS.

3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
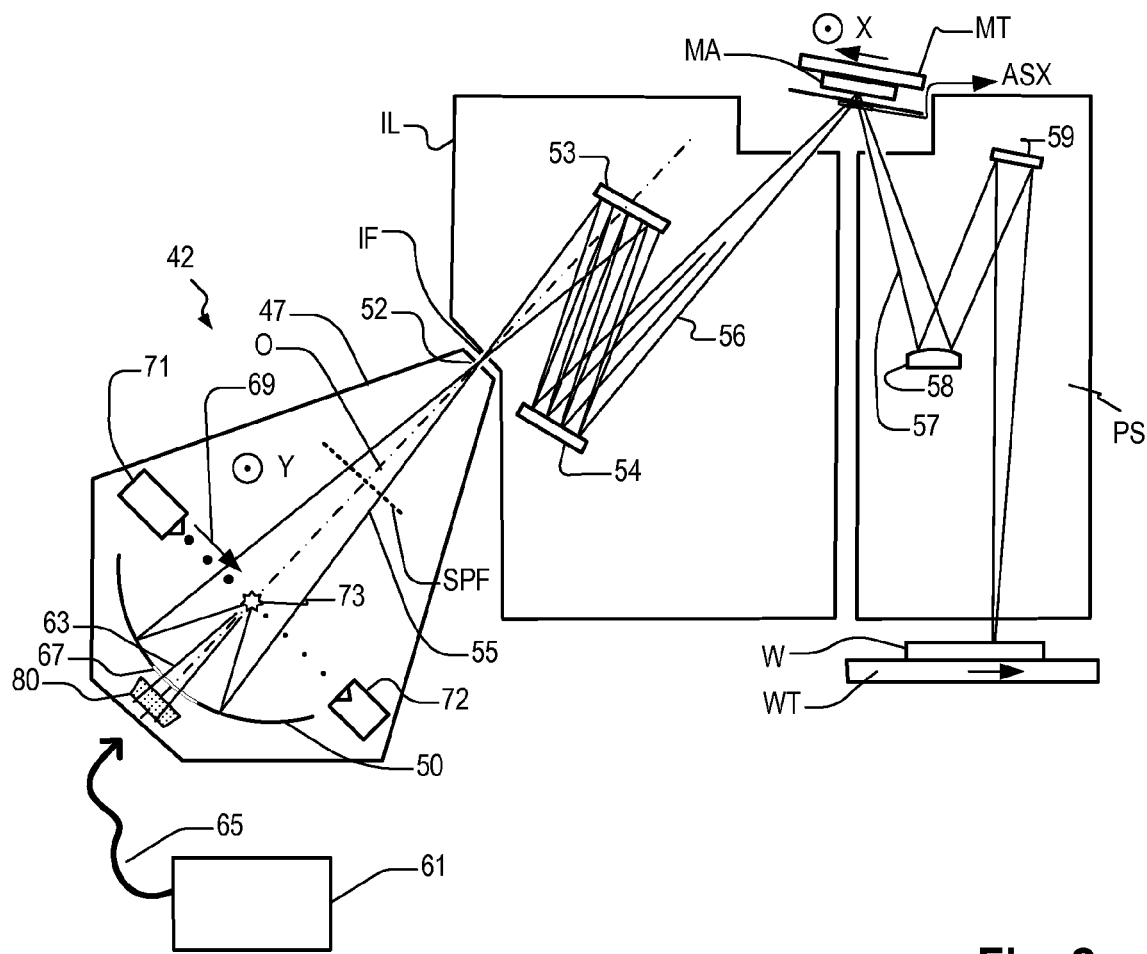
FIG. 2 is a more detailed view of the apparatus of FIG. 1.

FIG. 2 shows an embodiment of the lithographic apparatus in more detail, including a radiation system 42, the illumination system IL, and the projection system PS. The radiation system 42 as shown in FIG. 2 is of the type that uses a laser-produced plasma as a radiation source. EUV radiation may be produced by a gas or vapor, for example Xe gas, Li vapor or Sn vapor in which a very hot plasma is created to emit radiation in the EUV range of the electromagnetic spectrum. The very hot plasma is created by causing an at least partially ionized plasma by, for example, optical excitation using $CO_2$ laser light. Partial pressures of, for example, 10 Pa of Xe, Li, Sn vapor or any other suitable gas or vapor may be required for efficient generation of the radiation. In an embodiment, Sn is used to create the plasma in order to emit the radiation in the EUV range.

The radiation system 42 embodies the function of source SO in the apparatus of FIG. 1. Radiation system 42 comprises a source chamber 47, in this embodiment not only substantially enclosing a source of EUV radiation, but also radiation collector 50 which, in the example of FIG. 2, is a normal-incidence radiation collector, for instance a multi-layer mirror.

As part of an LPP radiation source, a laser system 61 is constructed and arranged to provide a laser beam 63 which is delivered by a beam delivering system 65 through an aperture 67 provided in the radiation collector 50. Also, the radiation system includes a target material 69, such as Sn or Xe, which is supplied by target material supply 71. The beam delivering system 65, in this embodiment, is arranged to establish a beam path focused substantially upon a desired plasma formation position 73.

In operation, the target material 69, which may also be referred to as fuel, is supplied by the target material supply 71 in the form of droplets. When such a droplet of the target material 69 reaches the plasma formation position 73, the laser beam 63 impinges on the droplet and an EUV radiation-emitting plasma forms inside the source chamber 47. In the case of a pulsed laser, this involves timing the pulse of laser radiation to coincide with the passage of the droplet through the position 73. As mentioned, the fuel may be for example xenon (Xe), tin (Sn) or lithium (Li). These create a highly ionized plasma with electron temperatures of several 10's of eV. Higher energy EUV radiation may be generated with other fuel materials, for example Tb and Gd. The energetic radiation generated during de-excitation and recombination of these ions includes the wanted EUV which is emitted from the plasma at position 73. The plasma formation position 73 and the aperture 52 are located at first and second focal points of radiation collector 50, respectively and the EUV radiation is focused by the normal-incidence collector mirror 50 onto the intermediate focus point IF.

The beam of radiation emanating from the source chamber 47 traverses the illumination system IL via so-called normal incidence reflectors 53, 54, as indicated in FIG. 2 by the radiation beam 56. The normal incidence reflectors direct the beam 56 onto a patterning device (e.g. reticle or mask) positioned on a support (e.g. reticle or mask table) MT. A patterned beam 57 is formed, which is imaged by projection system PS via reflective elements 58, 59 onto a substrate carried by wafer stage or substrate table WT. More elements than shown may generally be present in illumination system IL and projection system PS. For example there may be one, two, three, four or even more reflective elements present than the two elements 58 and 59 shown in FIG. 2. Radiation collectors similar to radiation collector 50 are known from the prior art.

As the skilled reader will know, reference axes X, Y and Z may be defined for measuring and describing the geometry and behavior of the apparatus, its various components, and the radiation beams 55, 56, 57. At each part of the apparatus, a local reference frame of X, Y and Z axes may be defined. The Z axis broadly coincides with the direction of optical axis O at a given point in the system, and is generally normal to the plane of a patterning device (reticle) MA and normal to the plane of substrate W. In the source module (apparatus) 42, the X axis coincides broadly with the direction of fuel stream (69, described below), while the Y axis is orthogonal to that, pointing out of the page as indicated. On the other hand, in the vicinity of the support structure MT that holds the reticle MA, the X axis is generally transverse to a scanning direction aligned with the Y axis. For convenience, in this area of the schematic diagram FIG. 2, the X axis points out of the page, again as marked. These designations are conventional in the art and will be adopted herein for convenience. In principle, any reference frame can be chosen to describe the apparatus and its behavior.

In addition to the wanted EUV radiation, the plasma produces other wavelengths of radiation, for example in the visible, UV and DUV range. There is also IR radiation present from the laser beam 63. The non-EUV wavelengths are not wanted in the illumination system IL and projection system PS and various measures may be deployed to block the non-EUV radiation. As schematically depicted in FIG. 2, a transmissive SPF may be applied upstream of the virtual source point IF. Alternatively or in addition to such a filter, filtering functions can be integrated into other optics. For example a diffractive filter can be integrated in radiation collector 50 and/or mirrors 53, 54 etc., by provision of a grating structure tuned to divert the longer, IR radiation away from the virtual source point IF. Filters for IR, DUV and other unwanted wavelengths may thus be provided at one or more locations along the paths of beams 55, 56, 57, within source module (radiation system 42), the illumination system IL and/or projection system PS.

To deliver the fuel, which for example is liquid tin, a droplet generator or target material supply 71 is arranged within the source chamber 47, to fire a stream of droplets towards the plasma formation position 73. In operation, laser beam 63 may be delivered in a synchronism with the operation of target material supply 71, to deliver impulses of radiation to turn each fuel droplet into a plasma. The frequency of delivery of droplets may be several kilohertz, or even several tens or hundreds of kilohertz. In practice, laser beam 63 may be delivered by a laser system 61 in at least two pulses: a pre pulse PP with limited energy is delivered to the droplet before it reaches the plasma location, in order to vaporize the fuel material into a small cloud, and then a main pulse MP of laser energy is delivered to the cloud at the desired location, to generate the plasma. In a typical example, the diameter of the plasma is about 2-3 mm. A trap 72 is provided on the opposite side of the enclosing structure 47, to capture fuel that is not, for whatever reason, turned into plasma.

Laser system 61 in may be for example of the MOPA (Master Oscillator Power Amplifier) type. Such a laser system 61 includes a "master" laser or "seed" laser, followed by a power amplifier system PA, for firing a main pulse of laser energy towards an expanded droplet cloud, and a pre pulse laser for firing a pre pulse of laser energy towards a droplet. A beam delivery system 24 is provided to deliver the laser energy 63 into the source chamber 47. In practice, the pre-pulse element of the laser energy may be delivered by a separate laser. Laser system 61, target material supply 71 and other components can be controlled by a controller (not shown separately. The controller performs many control functions, and has sensor inputs and control outputs for various elements of the system. Sensors may be located in and around the elements of radiation system 42, and optionally elsewhere in the lithographic apparatus. In some embodiments of the present invention, the main pulse and the pre pulse are derived from a same laser. In other embodiment of the present invention, the main pulse and the pre-pulse are derived from different lasers which are independent from each other but controlled to operate synchronously. A problem that can arise in the LPP source apparatus is that optical elements of the laser beam deliver system 65 will become contaminated with debris from the plasma. In particular a final optical element, be it a lens or a mirror, is directly exposed to particles of fuel ejected from the plasma. A refractive (transmissive) element will quickly become obscured by tin deposits, leading to reduced transmission of the laser radiation and undesired heating. A reflective final element, such as a copper mirror, may be more tolerant of Sn deposits for time, but will need cleaning eventually to maintain efficiency of reflection and focusing.

In order to block as much contamination as possible, a contamination trap 80 of some sort may be provided between the plasma formation site 73 and optical elements of the beam delivery system 65. A so-called foil trap is known for use in such cases. The trap may be a static or a rotating foil trap, or a combination of both. The rotating foil trap (RFT), as is known in the art, comprises a number of thin vanes aligned with the radiation direction so as to present as little obstruction to the wanted radiation beam. The vanes extend in length parallel to the beam direction, and extend radially from the optical axis (O). When the foils rotate about the optical axis O, slower-moving contaminant particles are caught by the sweeping motion of the vanes. Unfortunately, the foil trap itself constitutes some obstruction to the beam, resulting in loss of radiation power delivered to the plasma formation position 73. The radiation absorbed by the trap leads to heating, consequently distortion of the trap and radiation from it. Consequently, the RFT may not be effective in maintaining overall performance of the apparatus. Other types of trap, for example those based on counter-flowing gas, are deployed instead (e.g. low pressure nitrogen). These other types of trap are not necessarily so effective at stopping the debris.

LPP EUV sources can have a high infrared (IR) content in its output, largely from the IR radiation emitted by the laser used to excite the fuel, which is reflected back off the fuel droplet and towards the radiation collector. This IR content should be removed as much as possible from the source output to prevent wafer heating and optics (over)heating, leading to overlay errors.

Figure 3:
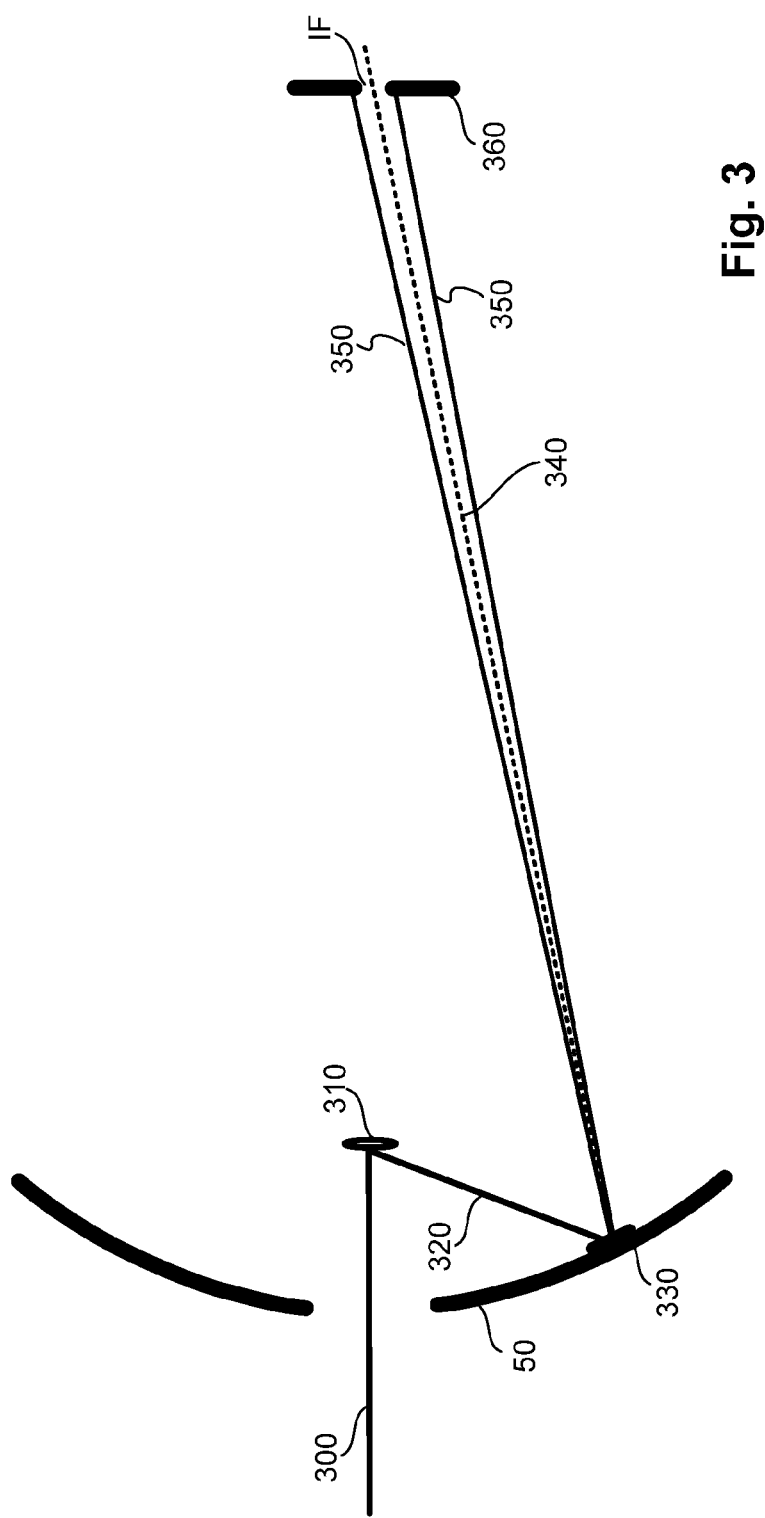
FIG. 3 shows an EUV source arrangement illustrating the function of a suppression filter.

This issue is illustrated schematically in FIG. 3. FIG. 3 shows an IR laser beam 300 incident on a fuel droplet 310 at the plasma formation position. Some IR radiation 320 emitted from IR laser beam is reflected off fuel droplet 310 and back towards radiation collector 50. IR filtering may be realized by provision of suppression filter 330 integrated into the radiation collector 50 surface (sometimes referred to as a 'spectral purity filter (SPF) radiation collector'). The suppression filter 330, which may define a grating, is tuned to cancel zeroth order reflected radiation 340 (shown dotted as this is essentially suppressed by the suppression filter 330) for the driving IR wavelength (which may be in the region of 10.6 μm, although other driving wavelengths are possible, for example 1.06 μm). First order reflected radiation 350 (and other orders) can then be blocked by a clipping aperture 360 at or near the intermediate focus (IF).

The suppression filter 330, located on the radiation collector, uses the basic principle of destructive interference whereby each contribution from the top areas (defining a first reflective surface) of the suppression filter are canceled by an out-of-phase equal contribution from the bottom areas (defining a second reflective surface). This equates to equal areas for top and bottom (Duty Cycle DC=50%), and a separation distance between each reflective surface H of λ/4, or more generally:

$$H = K\left(\frac{n}{2} + \frac{1}{4}\right)\lambda \quad \text{Equation (1)}$$

for all values of integer n. K is a correction factor based upon the angle of incidence α of the radiation on the filter. K=1 for normally incident radiation, but more generally takes the form:

$$K = \frac{2\cos\alpha}{1 + \cos(2\alpha)}$$

Consequently, it can be seen that the separation distance H is the product of the wavelength to be suppressed and a factor dependent on integer n.

This zeroth order cancellation is specific to a single specific wavelength, and is not effective against secondary lines. This means that secondary IR lines are not suppressed effectively, and so it will be required to remove these secondary lines in the IR laser or delivery system. This limitation limits net IR output from the laser system by effectively preventing the use of multiple $CO_2$ output lines.

Some current $CO_2$ IR-lasers output a strong secondary output band around wavelength 9 μm, e.g., 9.4 μm, in addition to the main output band around an output line of wavelength 10.6 μm. Harnessing the radiation output at this secondary output band could increase overall output significantly.

Generally, the fraction of power f which goes into the zeroth order is approximately:

$$f = \frac{1}{2}\sin^2\left(\frac{4\pi H}{K\lambda}\right) \quad \text{Equation (2)}$$

Equation (2) is valid if $$\frac{4H}{K\lambda}$$

is approximately an odd integer. In an embodiment, an approximate odd integer may be a value which differs from an odd integer by no more than +/−0.1. More specifically, this difference may be no more than +/−0.05, no more than +/−0.04, or no more than +/−0.02.

A suppression filter optimized for the suppression of 10.6 μm wavelength radiation (i.e., H=2.65 μm for normally incident radiation), will reflect too great a proportion of radiation at the 9.4 μm wavelength into the zeroth order as is acceptable. According to Equation (1) above, the fraction f will be 0.08 (8%), while anything more than 1% would be unacceptably high. A compromise suppression filter element height of 2.491 μm (halfway between a depth optimized for 10.6 μm wavelength radiation and optimized for 9.4 μm wavelength radiation) would mean fraction f=0.0176 for both 9.4 μm wavelength radiation and 10.6 μm wavelength radiation, which is again too high.

Figure 4:
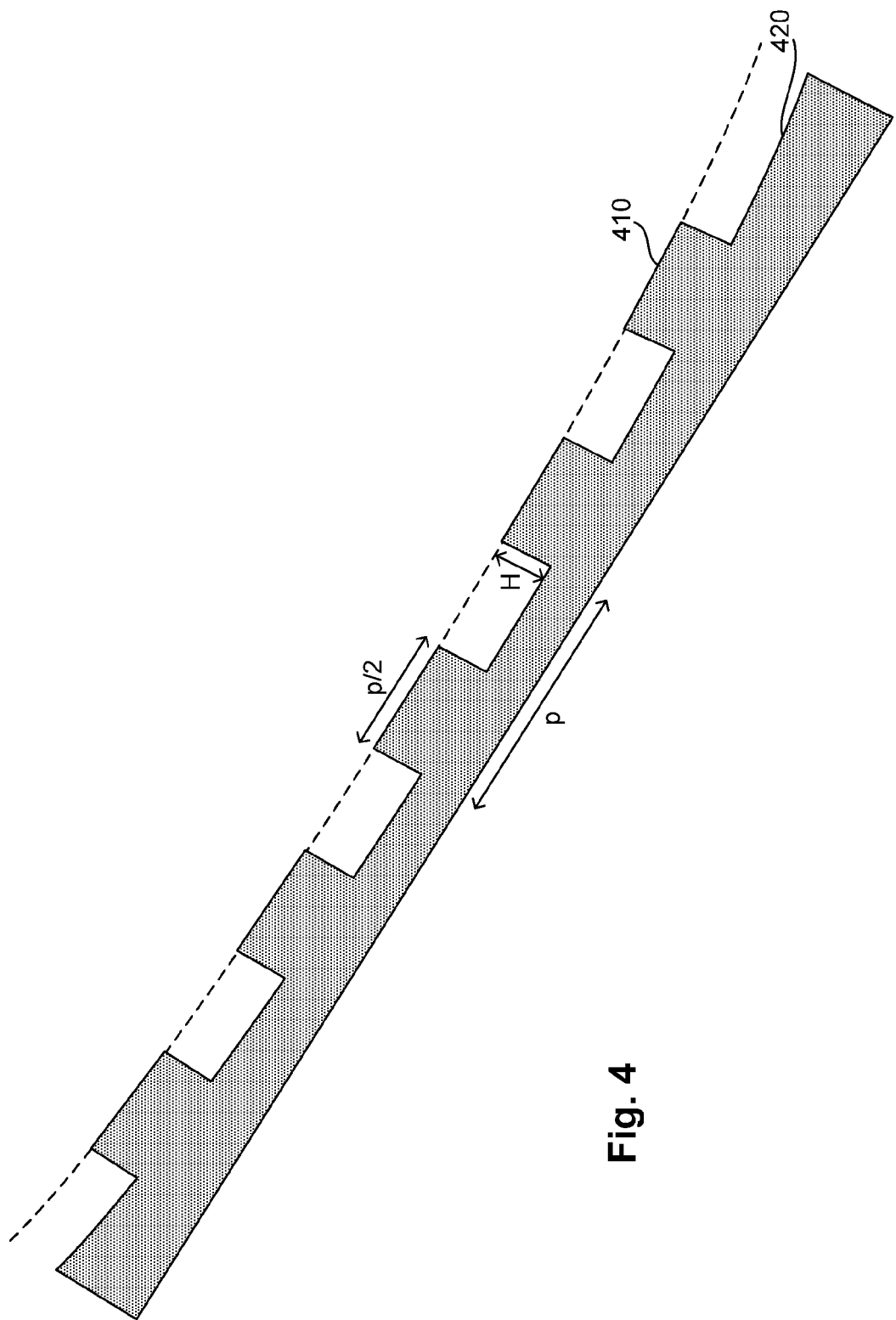
FIG. 4 illustrates a first suppression filter arrangement according to a first embodiment of the invention.

FIG. 4 shows part of a radiation collector comprising a suppression filter according to a first embodiment. Parameter p is the pitch of the suppression filter, and parameter H is the separation distance between reflective surfaces 410, 420. The reflective surfaces 410, 420 may comprise an (at least approximate) part-ellipsoid surface curvature which each has an intermediate focus and the plasma formation position as its focal points (see FIG. 3). A typical suppression filter may have the same general form as that illustrated in FIG. 4, but with a separation distance H of Kλ/4 (e.g., K*2.65 μm when optimized for 10.6 μm radiation). A typical pitch p may be, for example, of the order of 1 mm. As will be expanded on below, separation distance H may vary along the length of the suppression filter because of the K factor.

To address the aforementioned issues, it is proposed to find a common separation distance which suppresses both the first wavelength and the second wavelength. In an embodiment, this is done by determining approximate integer values $n_1$ and $n_2$ which satisfy the following approximate equation to an acceptable degree:

$$\frac{2n_2 + 1}{2n_1 + 1} \approx \frac{\lambda_1}{\lambda_2} \quad \text{Equation (4)}$$

where $\lambda_1$ and $\lambda_2$ are respectively the first and second wavelengths which are to be suppressed.

Once $n_1$ and $n_2$ have been determined using Equation (4), a corresponding separation distance H for the first and second wavelengths should be found. The separation distance H can be found using either of Equation (5.1) or Equation (5.2) below. A suppression filter can then be designed with this separation distance H:

$$H = K\left(\frac{n_1}{2} + \frac{1}{4}\right)\lambda_1 \quad \text{Equation (5.1)}$$

$$H = K\left(\frac{n_2}{2} + \frac{1}{4}\right)\lambda_2 \quad \text{Equation (5.2)}$$

While $n_1$ and $n_2$ have been selected to best find a common separation distance, it may be that the separation distance H calculated using Equation (5.1) may differ slightly to that calculated using Equation (5.2). This will depend on how accurately Equation (4) is satisfied. Where they do differ, the difference should be small and it should not matter which is chosen; it is also possible to choose a separation distance between H as calculated using Equation (5.1) and Equation (5.2) (e.g., halfway between the two). However, by careful selection of values of approximate integers $n_1$ and $n_2$ (and optionally of one or both wavelengths $\lambda_1$ and $\lambda_2$ as will be described below), values for H can be determined which are the same (to at least the nearest 0.01 μm), regardless of which of Equations (5.1) or (5.2) is used.

The approximate integers $n_1$ and $n_2$ which acceptably satisfy Equation (4) may be true integers, or may differ from true integers, to better satisfy Equation (4). Such approximate integers, while not actually integers, should be sufficiently close to integer values to meet the criteria for destructive interference as defined in Equation (2).

It is disclosed above that values for $n_1$ and $n_2$ which satisfy Equation (4) to an acceptable degree should be found, and that $n_1$ and $n_2$ should be approximate integers. Whether Equation (4) is acceptably satisfied and whether $n_1$ and $n_2$ are sufficiently close to integers can be assessed by determining the resultant separation distance H and then determining whether the deviation of the value of $$\frac{4H}{K\lambda} \qquad \text{(Equation (2))}$$

from an odd integer is sufficiently small to meet the requirement for destructive interference (i.e., results in a value for f which is sufficiently low).

If $$\frac{4H}{K\lambda}$$

is restated as N+d, where N is $$\frac{4H}{K\lambda}$$

rounded to the nearest (odd) integer and d is the difference of $$\frac{4H}{K\lambda}$$

and N (i.e., the amount $$\frac{4H}{K\lambda}$$

deviates from the odd integer), then Equation (2) becomes:

$$f = \frac{1}{2}\sin^2(\pi(N+d)) \qquad \text{Equation (6)}$$
$$f \approx 4.9\ d^2$$

In an embodiment, values of $n_1$ and $n_2$ (and optionally $\lambda_1$ and $\lambda_2$) should be found which determine a value for the separation distance H that minimizes d such that it is less than 0.1 (f<0.05). In other embodiments, values of $n_1$ and $n_2$ (and optionally $\lambda_1$ and $\lambda_2$) will be determined which minimize d to be less than 0.05 (f<0.012), to be less than 0.04 (f<0.0078), to be less than 0.02 (f<0.0019), or to be less than 0.015 (f<0.0011)

In a specific embodiment, where $\lambda_1$ is between 10.3 and 10.8 μm and more specifically equals 10.6 μm and $\lambda_2$ is between 9 μm and 9.6 μm, and more specifically equals 9.4 μm (all figures to the nearest 0.1 μm), it can be seen that a good approximation to satisfy Equation (4) is when $n_1$=7 and $n_2$=8. This will result in a separation distance H of approximately K*39.75 μm to K*39.95 μm. A better approximation for $n_1$ can be found between 7 and 7.03, more specifically 7.02, and for and $n_2$ between 7.97 and 8, more specifically 7.98; as these values better satisfy Equation (4) for $\lambda_1$=10.6 μm and $\lambda_2$=9.4 μm. This will result in a separation distance H of (for example) K*39.86 μm. Such a separation distance will limit the fraction of power going into the zeroth order to something in the region of 0.8%. It is important to note that these examples are provided to teach the principle, and that the actual values for any of the above parameters may vary to obtain a smaller value for the fraction f. Firstly, it should be appreciated that the example wavelengths provided are not exact, and can also be varied (as discussed below). Therefore, by way of further example, if $\lambda_1$ is 10.6 μm and $\lambda_2$ is 9.36 μm, then $n_1$ can be 7.005 and $n_2$ can be 7.995. This will result in a value for H of 39.8 μm and a consequent fraction f less than 0.2% for $\lambda_1$ and significantly less for $\lambda_2$. It may be also that significantly higher values of $n_1$ and $n_2$ may be necessary to further reduce the fraction f. In some embodiments, the value of H will be such that the fraction f is less than 1%, less than 0.5%, less than 0.2% or less than 0.1% over the two wavelengths.

Another possible refinement, is to refine or select the wavelengths $\lambda_1$ and $\lambda_2$ to better satisfy Equation (4). Where the radiation is output from a laser (e.g., a $CO_2$ laser), this may comprise tuning one or both of the main laser output lines. It can be shown that there are, in fact, more output lines available in the $CO_2$ output spectrum. Therefore, when determining H, it is preferable to consider the exact lines and linewidths of the output radiation, and derive $n_1$ and $n_2$ accordingly.

Preferably, the pitch p of the suppression filter should not greatly exceed 1 mm, since a larger pitch will result in a smaller diffraction angle. If the diffraction angle becomes too small, the higher order reflected radiation (e.g., first order reflected radiation 350 in FIG. 3) will pass through clipping aperture 360.

Figure 5:
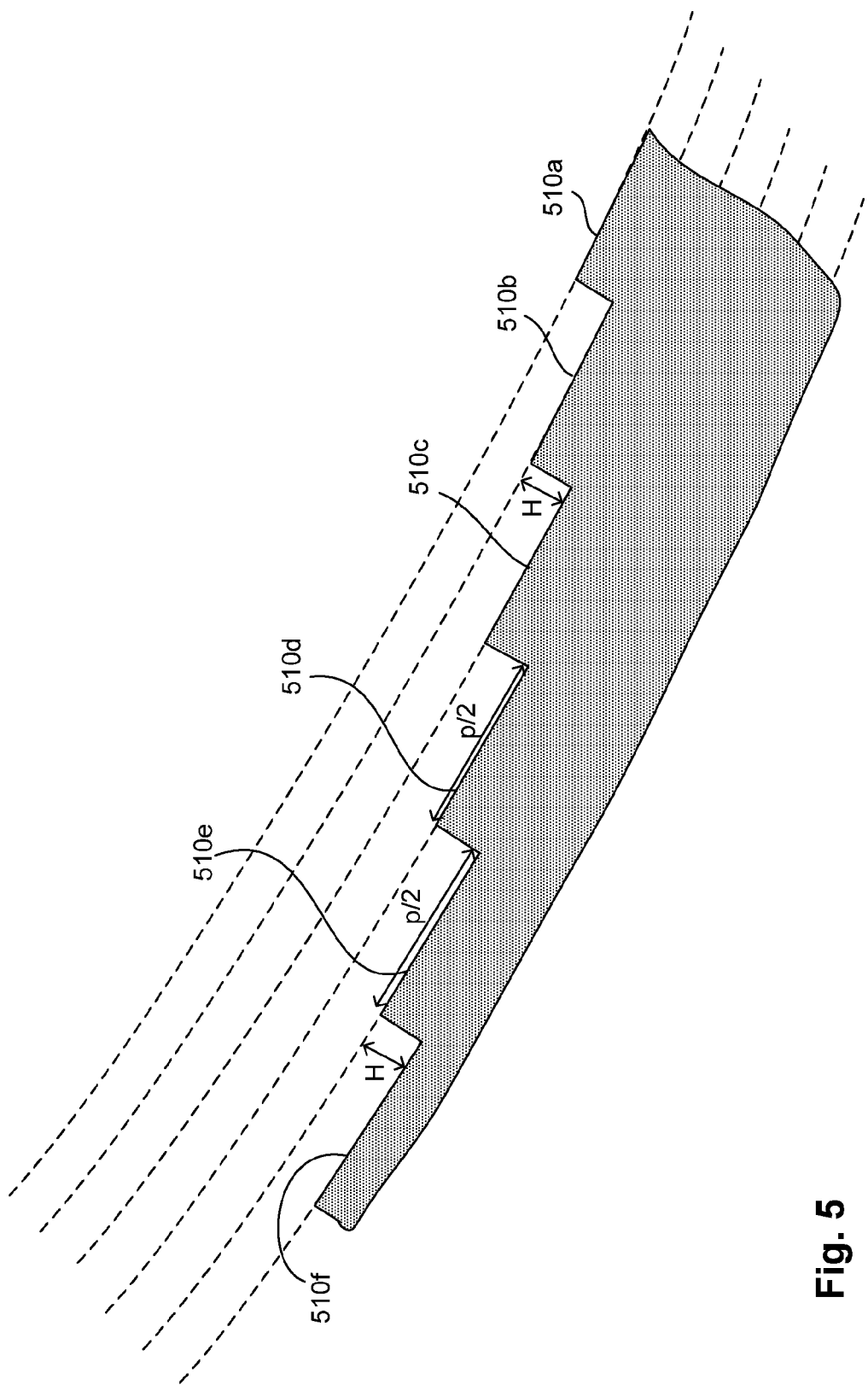
FIG. 5 illustrates a second suppression filter arrangement according to a second embodiment of the invention.

The configuration of FIG. 4, having two reflective surfaces, may lead to shadowing of the incident EUV radiation at the edges of the trenches defined by the suppression filter. This may particularly be an issue for larger separation distances H, such as those defined herein. As pitch p cannot be too large (see above), the ratio of H/p may be so large, as to result in significant EUV power loss. To address this, FIG. 5 illustrates an alternative proposal for the suppression filter profile. In this embodiment, there are a plurality (>2) of reflective surface levels 510a-510f, each comprising the same area. The separation distance between each reflective surface level is H as defined herein. The width of each reflective surface has a width of half the pitch. The profile of the suppression filter is a stepwise profile. In an embodiment, each surface level may define an at least approximate (part) ellipsoidal profile.

It should be noted that the actual value of H may vary along the reflective surface, in either of the FIG. 4 and FIG. 5 embodiment, due to its dependence on the K correction factor. Over the reflective surface, the angle of incidence of radiation 320 (FIG. 3) on the suppression filter, and therefore K, will vary. Therefore, by way of example, in FIG. 4 the surface 410 may define a single part-ellipsoid, and the variation of the separation distance H over the surface will cause surface 420 to deviate from that of a single part-ellipsoid. Alternatively, surface 420 may define a single part-ellipsoid, and therefore the variation of the separation distance H over the surface will cause surface 410 to deviate from that of a single part-ellipsoid. It may also be that neither surfaces 410 and 420 define single part-ellipsoids.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A reflective suppression filter of an EUV radiation source, comprising:
  a first area and a second area at respective first and second reflective surface levels,
  wherein the first area is adjacent the second area at a separation distance determined in a direction substantially perpendicularly to the first area and to the second area, the separation distance being based in part on a correction factor of an angle of incidence ($\alpha$) of radiation incident on the reflective suppression filter, wherein the correction factor value$\neq$1 and is equivalent to:

$$\frac{2\cos\alpha}{1+\cos(2\alpha)};$$

wherein the reflective suppression filter is configured to suppress reflection of a first component of a first wavelength and a second component of a second wavelength of the radiation incident on the reflective suppression filter, the first wavelength being different from the second wavelength,
  wherein the separation distance is configured to cause substantially destructive interference between the first component reflected off the first area and the first component reflected off the second area and to cause substantially destructive interference between the second component reflected off the first area and the second component reflected off the second area.

2. The reflective suppression filter of claim 1, wherein the separation distance is made to be close to proportional to a first odd number of half the first wavelength and close to proportional to a second odd number of half the second wavelength.

3. The reflective suppression filter of claim 1, further comprising:
  a third area at the first reflective surface level and a fourth area at the second reflective surface level; and
  wherein the third area is adjacent the fourth area and the second area.

4. The reflection suppression filter of claim 1, wherein:
  the first wavelength lies in a first interval between 10.5 micron and 10.7 micron, and
  the second wavelength lies in a second interval between 9.3 micron and 9.5 micron.

5. The reflective suppression filter of claim 1, wherein:
  the first reflective surface level and the second reflective surface level are part of a series of successive reflective surface levels, and
  each subsequent reflective surface level in the series of successive reflective surface levels defines an at least part of an ellipsoidal profile of the suppression filter.

6. The reflective suppression filter of claim 1, wherein the separation distance is not uniform across the first reflective surface level and the second reflective surface level respectively.

7. An EUV radiation source operative to generate EUV radiation by irradiating fuel with laser radiation to generate a plasma, the EUV radiation source comprising a radiation collector comprising a reflection suppression filter comprising:
  a first area and a second area at respective first and second reflective surface levels,
  wherein the first area is adjacent the second area at a separation distance determined in a direction substantially perpendicularly to the first area and to the second area, the separation distance being based in part on a correction factor of an angle of incidence ($\alpha$) of radiation incident on the reflective suppression filter, wherein the correction factor value$\neq$1 and is equivalent to:

$$\frac{2\cos\alpha}{1+\cos(2\alpha)};$$

wherein the reflective suppression filter is configured to suppress reflection of a first component of a first wavelength and a second component of a second wavelength of the radiation incident on the reflective suppression filter, the first wavelength being different from the second wavelength,
  wherein the separation distance is configured to cause substantially destructive interference between the first component reflected off the first area and the first component reflected off the second area and to cause substantially destructive interference between the second component reflected off the first area and the second component reflected off the second area.

* * * * *